United States Patent [19]
Dombroski

[11] Patent Number: 5,457,071
[45] Date of Patent: Oct. 10, 1995

[54] STACKABLE VERTICAL THIN PACKAGE/PLASTIC MOLDED LEAD-ON-CHIP MEMORY CUBE

[75] Inventor: Edward J. Dombroski, Jericho, Vt.

[73] Assignee: International Business Machine Corp., Armonk, N.Y.

[21] Appl. No.: 116,320

[22] Filed: Sep. 3, 1993

[51] Int. Cl.⁶ .................................................. H01L 21/60
[52] U.S. Cl. ........................... 437/217; 437/209; 437/214; 437/215; 437/220
[58] Field of Search ..................... 437/217, 209, 437/211, 214, 220, 208, 205, 207, 219

[56] References Cited

U.S. PATENT DOCUMENTS

| | | |
|---|---|---|
| 3,922,712 | 11/1975 | Stryker . |
| 4,862,245 | 8/1989 | Pashby et al. . |
| 5,134,094 | 7/1992 | Schovanec ................... 437/217 |
| 5,198,888 | 3/1993 | Sugano et al. ................ 437/208 |
| 5,275,975 | 1/1994 | Baudouin et al. ............ 437/217 |
| 5,286,679 | 2/1994 | Farnworth ...................... 437/217 |

Primary Examiner—Brian E. Hearn
Assistant Examiner—Kevin M. Picardat
Attorney, Agent, or Firm—Francis J. Thornton

[57] ABSTRACT

This is a semiconductor chip package configuration particularly suited for stacking. These described arrangement is especially adapted to be used with the so-called Lead-On-Chip type package. Each package is of minimum size, and provided with a thermal heat sink arranged with respect to the remainder of the package to balance the stresses induced in the package during fabrication. This is accomplished by placing a lead frame on the active face of the semiconductor chip, bonding the lead frame conductors to respective input/output pads on the active face of the chip, and molding an encapsulant completely around five of the six sides of the chip but leaving a substantial portion of the sixth side unencapsulated. A heat sink is affixed on the exposed, i.e. unencapsulated, portion of the sixth side of the chip. The heat sink is comprised of a metal capable of thermally conducting and dissipating waste heat away from the chip and is of a mass, thickness, and area to counterbalance stresses such, as bending stresses, introduced into the chip by the application of the lead frame and encapsulant to the chip. The heat sink can also employed as a ground plane to provide an electromagnetic shield when the chips are arranged in a stack.

15 Claims, 6 Drawing Sheets

STACKABLE VERTICAL THIN PACKAGE/PLASTIC MOLDED LEAD-ON-CHIP MEMORY CUBE

FIELD OF THE INVENTION

This invention relates to lead bonded semiconductor chips. More particularly it relates to the so-called Lead-On-Chip (LOC) package configuration arranged in a stack and a method of creating the stack. Each package is created to be of minimum size, and provided with a thermal heat sink arranged with respect to the remainder of the package to balance the stresses in the package.

DESCRIPTION OF THE PRIOR ART

Lead-On-Chip (LOC) packages are now well known to the semiconductor industry and are fully described in U.S. Pat. No. 4,862,245 assigned to the same assignee as the present invention. Heat sinks have also been attached to the backside, i.e. the nonactive face, of semiconductor chips as shown in U.S. Pat. No. 3,922,712. U.S. Pat. No. 4,868,712 discloses a stack of semiconductor devices with heat sinks attached thereto.

Circuits formed in semiconductor chips have, over the years, become small, fast and dense yet the demands of the users require still smaller, faster and denser configurations which impose unique package size and thermal conditions. This invention provides a still smaller size, than any now known to the prior art, with improved electrical and thermal characteristics.

SUMMARY OF THE INVENTION

An object of the present invention is to provide an ultra-thin package for a semiconductor chip, using LOC technology, which meets the size and thermal conditions presently required by the industry. This desirable result is accomplished by the encapsulation of a chip, with a plastic encapsulating material, on at least five of its six sides while attaching the heat sink directly to the sixth side of the chip.

Furthermore, it is another object of the invention that the heat sink be designed to balance the stresses on the chip introduced by the application of the leads on the active chip face and the encapsulation.

It is another object of the invention to provide a packaged semiconductor chip with improved mechanical and electrical performance.

It is yet another object of the invention to provide a thinner semiconductor package with a heat sink that was previously obtained in the prior art.

It is a further object of the present invention to provide a multiple semiconductor package arrangement with enhanced reliability due to improved stress balancing and heat extraction.

These and other objects of the present invention are realized and provided by placing a lead frame, having reduced thickness conductors, over the active face of the semiconductor chip, bonding the lead frame conductors to respective input output pads on the active face, and molding an encapsulant completely around five of the six sides of the chip but leaving a substantial portion of the sixth side unencapsulated. The unreduced portions of the lead frame conductors are arranged to extend out of the encapsulant and a heat sink is affixed on the exposed, i.e. unencapsulated, portion of the sixth side of the chip. The heat sink is comprised of a metal capable of thermally conducting and dissipating waste heat away from the chip and is of a mass, thickness, and area to counterbalance stresses such, as bending stresses, introduced into the chip by the application of the lead frame and encapsulant to the chip. The heat sink can also be employed as a ground plane to provide an electromagnetic shield when the chips are arranged in a stack.

These and other objects, features, and advantages of the invention will be apparent from the following more particular description of the preferred embodiment of the invention as illustrated in the accompanying drawings.

DESCRIPTION OF THE PREFERRED EMBODIMENT

Figure 1:
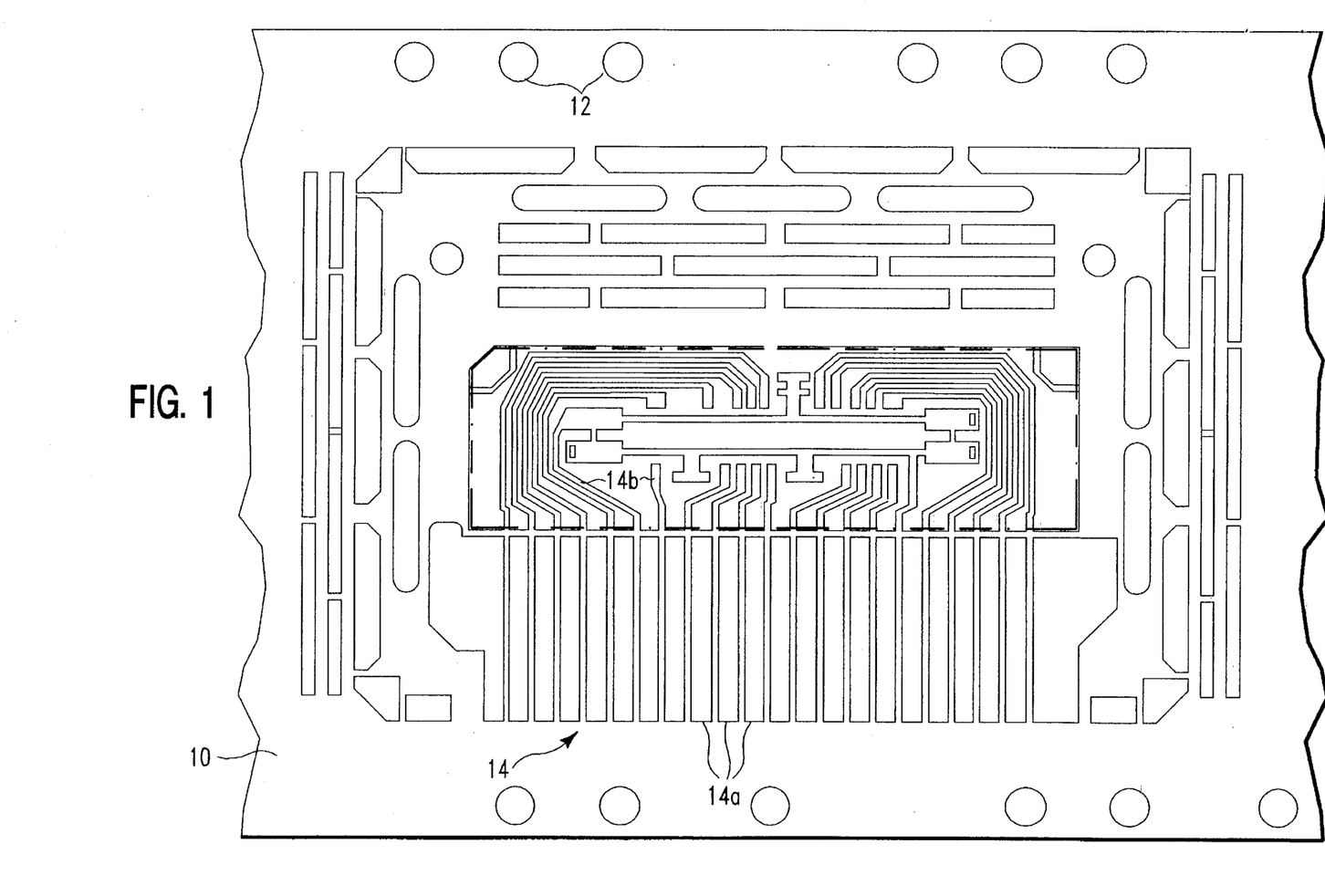
FIG. 1 shows a typical lead frame as might be used in the present invention.

FIG. 1 is a top view of a lead frame as would be used in the present invention. The lead frame 10 is produced from metal sheet stock and formed with a plurality of indexing holes 12 and provided with a plurality of extended conductors 14. Such lead frames are preferably made from a copper alloy and are well known and have a definite meaning in the semiconductor art. The material, thickness and strength of such lead frames have been so long known to the art that the use of the term "lead frame" as used in the art is all that is needed to purchase such items. In essence the term "lead frame" means a metal structure, preferably a plated copper alloy, formed of sheet stock of a sufficient size and strength to meet specific mechanical strength requirements. For example such a lead frame is shown in the Semiconductor International, April 1985. In the present invention the lead frame is typically formed of sheet stock between 0.125 and 0.195 millimeters (mm) thick and the individual conductors are between 0.2 and 0.5 mm wide.

Figure 2:
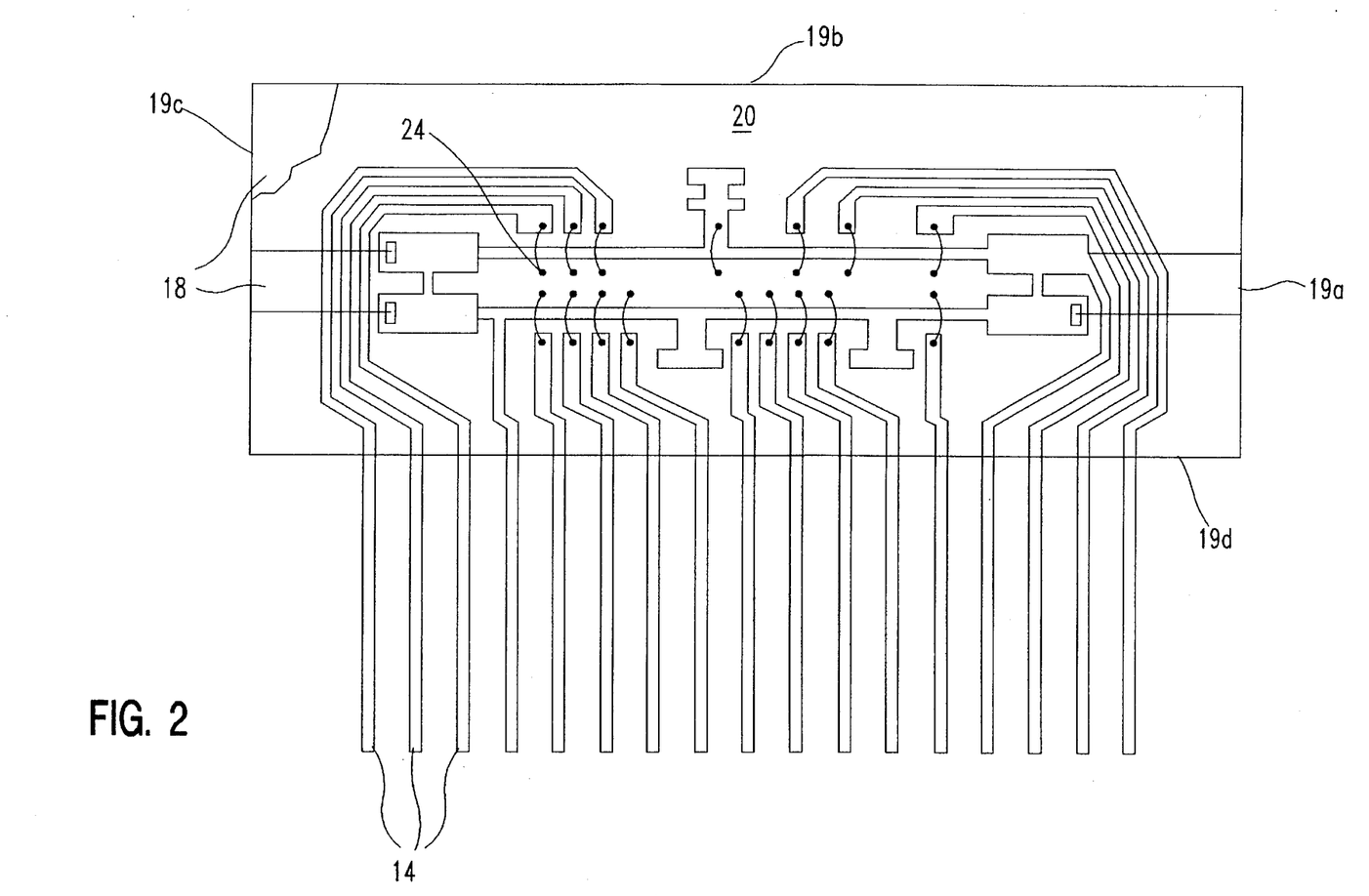
FIG. 2 shows a semiconductor chip on which the lead frame of FIG. 1 is positioned and bonded using wire bonds.
Figure 3:
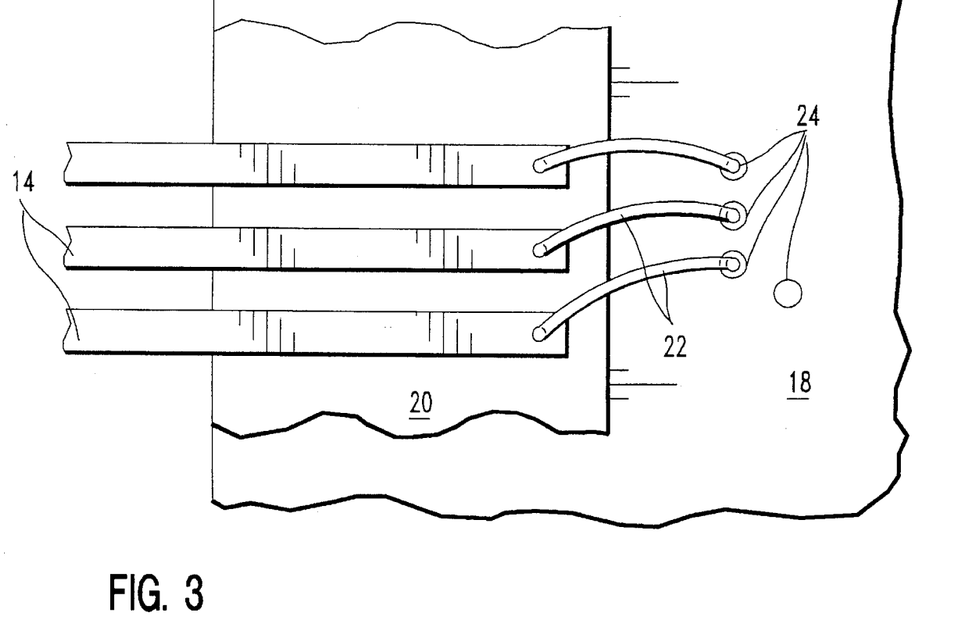
FIG. 3 shows a top view of a selected portion of the lead frame of FIG. 1 illustrating the wires bonding the lead frame to the chip.
Figure 4:
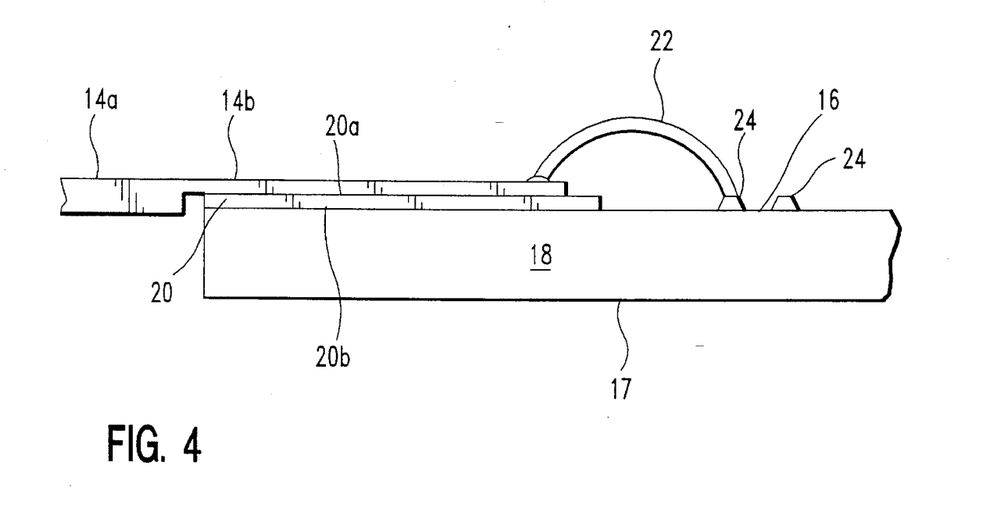
FIG. 4 shows a side view of the portion of the lead frame illustrated in FIG. 3.

FIGS. 2, 3, and 4 show a semiconductor chip 18 having first and second major surfaces 16 and 17, i.e. the front and back sides, substantially parallel to each other and four edges or minor sides 19a, 19b, 19c, and 19d, perpendicular to and joining said major surfaces. One major surface, i.e. major surface 16 is the active face of the chip in which integrated circuits are formed and input/output pads 24 are disposed and the other major surface is the back or substrate side of the chip. The lead frame of FIG. 1 is positioned on major surface 16 and bonded to the pads 24 using wire bonds. In the present invention, the chip 18 is typically 13.8 mm long and 6.8 mm wide and 0.76 mm thick. To prevent the portions of the lead frame conductors 14, that overly the active face 16 of the chip 18, from shorting the integrated circuit in the active face 16 a layer of insulating material 20 is positioned between the lead frame conductors 14 and the underlying portions of the active face 16.

The layer 20 is a polymer film which can stand a temperature in excess of 175 degrees Celsius and does not contain ionizable species such as halide and active metals including sodium (Na), potassium (K) and phosphorus (P). The layer 20 can be formed, for example, of a 0.05 mm thick polyamide film such as is sold by the DuPont de Nemours under the tradename "Kapton". Such polyamide films can be obtained in varying thickness and for the present invention would be between 0.025 mm and 0.05 mm in thickness. These films are usually, for this invention, thermally enhanced by aluminum and silicon nitride additions thereto.

The layer 20 has adhesive coatings 20a and 20b, which are applied as thin coatings, in the order of 0.02 mm thick, to the major surfaces of layer 20 and are used to help secure the layer 20 to the lead frame 14 and the chip 10. This layer 20 helps assure that short circuits between the lead frame and the chip do not occur. If desired, the adhesive layers applied to the different sides of layer 20 can be of different materials, for example, the adhesive coating 20b securing the layer 20 to the semiconductor chip 18 can be selected from the group of epoxies, acrylics silicones and polyimides with epoxies being preferred. The other adhesive coating 20a which holds the lead frame conductors to the layer 20 can be selected from the same group of materials with the epoxies, acrylics and polyimides containing phenolics being preferred. One material suitable for use as the adhesive layers 20a and 20b is sold by the Rogers Corporation of Chandler, Ariz., under the tradename "Rogers 8970".

Alternately one or more of the above listed adhesives themselves can, if laid down in sufficient thickness to provide the desired insulation qualities can be used in place of the Kapton film.

FIGS. 2 and 3 shows the inner end of the lead frame conductors bonded to the active face of the chip via the insulating layer 20. It should be noted that, in this view, the selvage, including the indexing holes 12, has been cut away from the conductors using techniques well known to the art. This bonding of the lead frame conductors to the active face 16 of the chip 18 requires heating the assembly to a temperature of about 160 degrees Celsius to fully cure the adhesive used as or in conjunction with the insulating layer 20. It has been found that during cool down of the assembly following this curing step that bending is induced in the silicon chip due to the difference in the thermal expansion rates between the chip, the layer 20 and the lead frame conductors. As is well known in the semiconductor art such bending of the semiconductor chip 18 can alter the electrical characteristics of the device or integrated circuits formed in the chip. Once the conductors are bonded to the active face of the chip, gold wires 22 are typically bonded between the tips 14b of respective conductors 14 and the input/output pads 24 on the active face 16 of the chip 18.

Figure 6:
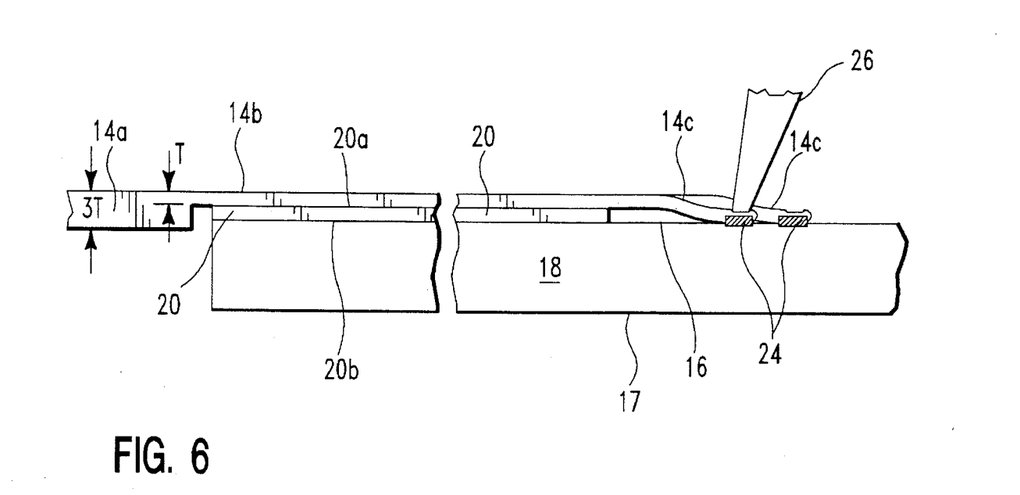
FIG. 6 shows a side view of the portion of the lead frame illustrated in FIG. 5.

It should be noted in FIG. 4 that the inner portions or proximal ends 14b of the lead frame conductors 14, i.e. in the region where they overlie the active face of the chip, are typically 0.254 mm wide, and have been thinned to one half thickness of the portion i.e. the distal ends 14a of the conductors extending beyond the edge of the chip. By maintaining the distal ends 14a of the conductors 14 at the original lead frame thickness, i.e typically 0.155 mm thick, they are assured of being of sufficient strength to be successfully handled and inserted into sockets or to be soldered or otherwise connected to printed circuits boards. As shown in FIGS. 4 and 6 the proximal ends 14b of the conductors 14 are reduced in thickness to be typically 0.076 mm and are designed to overly the active face of the chip. It should also be noted that in the example given the distal ends 14a are typically 0.41 mm wide and the proximal ends 14b are reduced in width to typically 0.255 mm in width.

By reducing the width and the thickness of the conductors 14 at the proximal ends 14b the stresses applied to the chip 18 and thus the bending of the chip 18, following the epoxy cure step and the application of the proximal ends of the conductors to the active face 16 of the chip 18, is greatly reduced thus substantially reducing if not eliminating the probability of altering the electrical characteristics of the integrated circuit built in the chip. This reduced thickness in the conductors also greatly minimizes the likelihood of delamination of the conductors from the underlying adhesive layer. Also by reducing the conductors in this region a significantly thinner profile package can be realized. Although the inner portions of the conductors are reduced in thickness where they overlie the active face of the chip that portion of the lead frame conductors 14, i.e. the distal ends 14b, which extends beyond the edge of the chip is maintained at full thickness to provide robust leads that are required by the bending and joining procedures to secure the devices to the next level of assembly.

Figure 5:
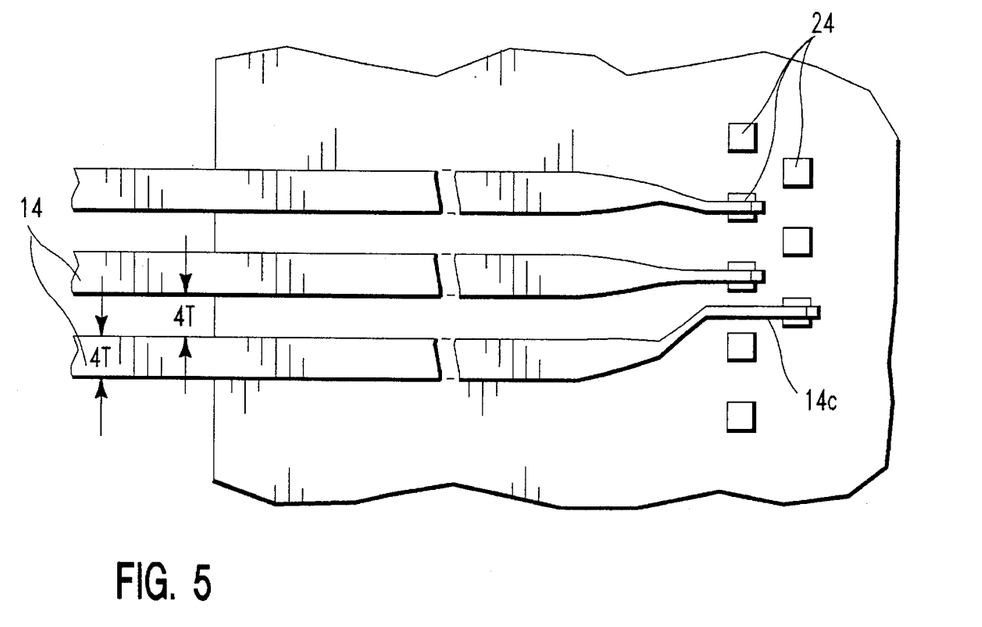
FIG. 5 shows a top view of a selected portion of the lead frame illustrating a different embodiment of bonding the lead frame to the chip.

FIGS. 5 and 6 show an alternative to the wire bonding technique. Here the proximal ends 14b of the lead frame conductors 14, instead of terminating on the insulating layer, are extended into tips 14c cantilevered over the pads 24 to which they are to be bonded. Subsequent to the placing of the lead frame on the insulating layer the tips 14c of the conductors 14 are forced against the pads 24 with a single point thermosonic bonding tool 26 to bond the each of the tips 14c directly to an underlying respective pad 24. By using this technique instead of wire bonding a still thinner package profile can be obtained.

Also this method of direct conductor to pad interconnection will further enhance electrical performance by reducing the inductance of the interconnections by the elimination of the gold wire as well as the discontinuity associated with signal reflections between the larger pad 24 and the smaller cross section wire 22.

Once the conductors 14 have been secured to the active face of the chip and the bond made between the proximal ends 14b of the conductors 14 and the input/output pads, the assembly is encapsulated in a suitable plastic material using well known transfer molding techniques.

Figure 7:
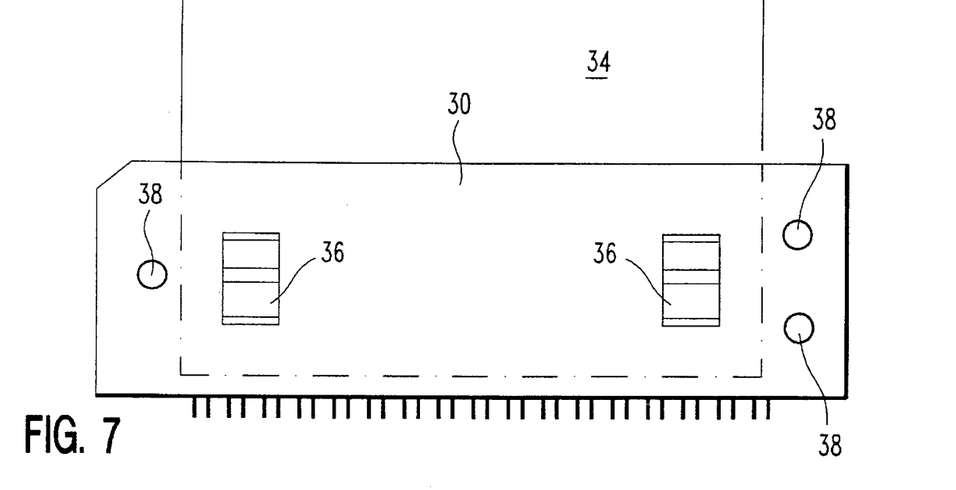
FIG. 7 shows the top view of an encapsulated chip in accordance with the present invention.
Figure 8:
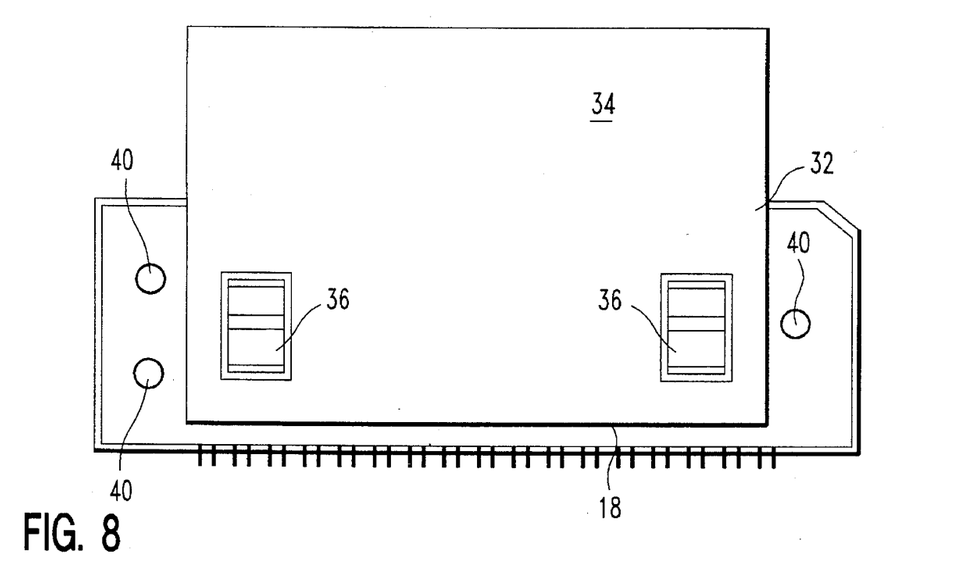
FIG. 8 shows the bottom view of an encapsulated chip in accordance with the present invention.

As shown in FIGS. 7 and 8 the encapsulant 30 is molded around five of the six sides of the chip 18 so as to encase the chip. The sixth side remains substantially uncovered with encapsulant so that there is a large recess 32 formed in the encapsulant in which the backside of the chip 18 remains exposed, i.e. unencapsulated. By leaving this area on the backside of the chip exposed an additional thin metallic member, typically 0.13 mm thick, in the form of a flat plate 34 can be secured to the chip. This plate 34 serves several functions. It not only, by being in good thermal contact with the backside of the chip, serves as a heat sink but also by having a good conductive bond to the ground connection on the chip can serve as a ground plane. This can be accomplished by either: first; when the substrate is ground, removing any oxide on the back surface of the chip 18 to which the plate 34 is to be attached and then conductively bonding the plate 34 to the chip 18 or second; when the substrate is not ground, insulatively bonding the plate 34 to the chip 18 and electrically connecting the plate by suitable means to an appropriate ground on the lead frame. The first of the above cases is to be used when the bulk silicon, i.e. the substrate, is electrical ground for the circuit formed in the active face. This plate 34 when acting as a ground plane improves the current rise time performance by decreasing the ground path inductance and provides better immunity to electrical noise created by mismatch. More importantly by selecting the thickness of the plate to be approximately equal to the thickness of the sheet stock from which the lead frame is made, i.e. between 0.12 mm and 0.165 mm thick, the plate will compensate for any bending moment induced in the chip by the application of the lead frame conductors and the encapsulation step. In this way no net bending defection results in the finished package. Also by extending the plate 34 beyond the edge of the encapsulant it will further enhance the dissipation of heat from the package.

The actual process of bonding this plate to the backside of the chip typically occurs during the chip encapsulation process. By joining the plate to the backside of the chip concurrent with the chip encapsulation the potential of further bending of the chip is substantially eliminated. A preferred method is as follows: The conductive plate is coated with a suitable thermosetting conductive adhesive such as is sold under the tradename AMICON C-991 by the Emerson and Cummings Co. or a modified epoxy amine sold under the tradename ABLEBOND 165-1L by the Ablestick Co. and placed in a suitably formed mold and the chip with the lead frame already attached is placed on the adhesively coated plate and if the adhesive is not conductive any necessary ground connection made to the plate. The mold is then closed and the encapsulant injected into the mold at a suitable temperature and pressure. By properly selecting these parameters the epoxy adhesive used to join the chip to the plate can be cured simultaneously with the curing of the encapsulant material. By following this procedure the final phase of package bending can be eliminated.

If the plate is not to be secured to the chip prior to or at the same time as the encapsulation the mold by proper design can be made to include a recessed area into which the plate can later be affixed. The plate attachment adhesive may then be simultaneously cured with the post mold cure process.

It is well known that the addition of decoupling capacitors can significantly improve the electrical characteristics of the circuits on the chip and that the improvement is directly related to the length of the inductive path between the capacitors and the chip circuits. Because the addition of decoupling capacitors is so desirable the mold can be formed to leave suitable openings 36 in both the front and the back of the encapsulant into which decoupling capacitors can be secured. These openings 36 are typically 1.8 mm wide and 3.30 mm long and can also be placed such that formed tabs on any capacitor inserted therein may intersect with suitable distal ends of the conductors on the lead frame that extend from the chip. By appropriately exposing selected lead frame conductors in these opening and connecting the capacitors to the exposed conductors the inductive path between the chip circuits and the capacitors is minimized.

Figure 9:
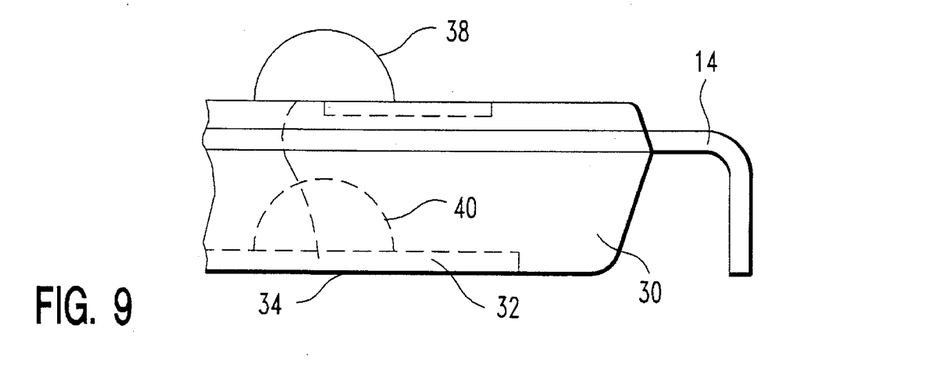
FIG. 9 shows side view of the encapsulated chip of FIGS. 7 and 8.

FIG. 9 shows an arrangement of the invention particularly adapted for stacking a number of packages in a cube. As shown in this figure molded protrusions 38 in the form of hemispherical bumps typically having a radius of 0.50 mm are molded in the lead frame side of the package and corresponding matched but slightly larger sockets 40, with a typical radius of 0.60 mm, are formed in the opposite side. These bumps and sockets serve to align the packages with one another so they can be stacked together to form a cube.

Figure 10:
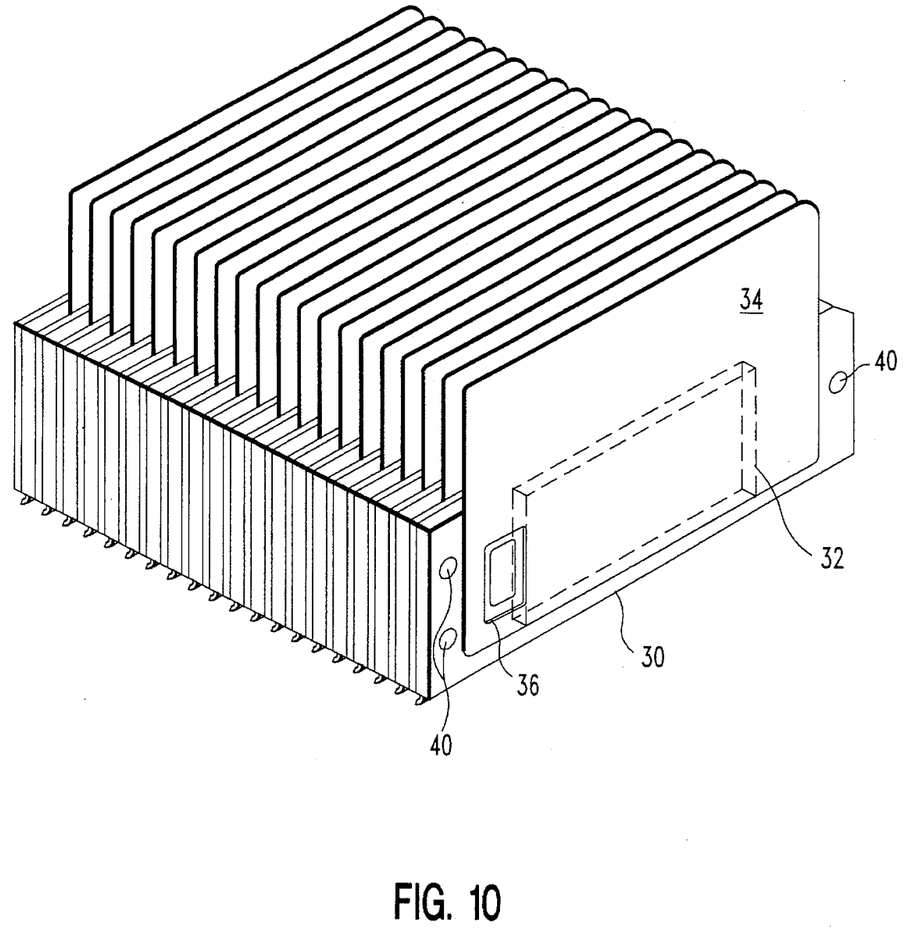
FIG. 10 illustrates a molded memory cube in accordance with the present invention.

FIG. 10 shows a plurality of the packages of FIG. 7 arranged in a stacked configuration. This stack is realized by coating the back side of the package with a thermoplastic polyimide adhesive such as is sold by the 3M company under the tradename "Scotch Brand 386". By placing this adhesive on the front surface the back surface of a another package can joined to it. When joining the packages the protrusions 38 in the form of hemispherical bumps, molded on the lead frame side of the package, mate with the corresponding matched sockets 40 formed in the opposite side. These bumps 38 and sockets 40 align each package with any adjacent package so they can be readily and positively stacked one onto the other.

Because the adhesive is a thermoplastic adhesive the stack requires a heating step to cause the adhesive to bond each package securely to the adjacent packages. In the described embodiment a temperature of about 230 degrees Celsius is used. This temperature is below the melting or softening temperature of any of the materials used in creating the packages, except of course for this adhesive layer. This heating step causes the packages to bond together. In this way any number of packages may be bonded together in a single stack.

Once such a stack has been assembled it can be tested and used. If, during test or subsequent use, one or more of the packages fail or found to be defective the stack can readily be disassembled. This disassembly can be done by again heating the stack to 210 degrees Celsius at which temperature the stack readily delaminates from the metallic plate. By following this procedure the stack can be easily separated into individual packages, the defective package removed from the stack, replaced with an operating package and the stack reassembled as discussed above.

This completes the description of the preferred embodiment of the invention. Other alternatives and modifications will now become apparent to those skilled in the art without departing from the spirit and scope of the invention as set forth in the following claims.

What is claimed is:

1. A method of forming a semiconductor package comprising the steps of;

providing a semiconductor chip having a first major surface with input and output bonding pads thereon, a second major surface substantially parallel to said first major surface and four minor surfaces substantially perpendicular to said major surfaces and joining said major surfaces, placing an insulating layer having a selected thickness on a selected portion of said first major surface, providing a lead frame having a plurality of conductors with distal and proximal ends and positioning the proximal ends of the conductors adjacent said first major surface of said chip and on said insulating layer, forming an electrical connection between each respective one of said proximal ends of said conductors and a respective one of each of said bonding pads on the chip, selecting a metallic plate, having a thickness sufficient to compensate for any bending moment induced in the chip by the application of the lead frame conductors and the insulating layer thereto, and securing said selected plate to said second major surface to compensate for any bending moment induced in the chip by the application of the lead frame conductors and the insulating layer thereto.

2. The method of claim 1 wherein there is further provided the step of encapsulating and substantially enclosing, with an insulating material, said first major surface, said four minor surfaces, the proximal ends of said conductors and partially enclosing a portion of said distal ends of said conductors, a portion of said distal ends being cantilevered from said encapsulation, said encapsulation step further includes encapsulating any portion of said second major surface uncovered by said metallic plate.

3. The method of claim 2 wherein there is further provided the step of forming a plurality of extending hemispheres in the encapsulation on said first major surface.

4. The method of claim 3 wherein there is further provided the step of forming in the encapsulation surrounding said minor surfaces a plurality of sockets that will mate with said extending hemispheres on any adjacent package.

5. The method of claim 1 wherein there is further provided the step of forming, in the encapsulation material on said first major surface, a small recess which exposes a selected one of said lead frame conductors.

6. The method of claim 1 wherein said metallic plate is selected to have a thickness at least equal to the thickness of said lead frame.

7. The method of claim 1 wherein there is further provided the step of encapsulating and substantially enclosing, with an insulating material, said first major surface, said four minor surfaces, the proximal ends of said conductors and partially enclosing a portion of said distal ends of said conductors, a portion of said distal ends being cantilevered from said encapsulation.

8. The method of claim 1 wherein said plate is selected to have a thickness substantially equal to the sum of the thickness of said proximal ends of said lead frame and said insulating layer.

9. The method of claim 2 wherein said plate is selected to have a thickness between 0.12 and 0.165 mm.

10. The method of claim 8 wherein there is further provided the step of encapsulating and substantially enclosing, with an insulating material, said first major surface, said four minor surfaces, the proximal ends of said conductors and partially enclosing a portion of said distal ends of said conductors, a portion of said distal ends being cantilevered from said encapsulation.

11. The method of claim 9 wherein there is further provided the step of encapsulating and substantially enclosing, with an insulating material, said first major surface, said four minor surfaces, the proximal ends of said conductors and partially enclosing a portion of said distal ends of said conductors, a portion of said distal ends being cantilevered from said encapsulation.

12. The method of claim 9 wherein there is further provided the step of thinning said proximal ends of said lead frame conductors to substantially one half the thickness of the distal ends of said conductors.

13. The method of claim 7 wherein said encapsulation step further includes encapsulating any portion of said second major surface uncovered by said metallic plate.

14. The method of claim 7 wherein said plate is selected to have a size substantially larger than said chip and to extend beyond the edge of said encapsulant.

15. A method of forming a stack of semiconductor packages comprising the steps of;

forming a plurality of semiconductor packages each package being formed by the process comprising the steps of;

providing a semiconductor chip having a first major surface with input and output bonding pads thereon, a second major surface substantially parallel to said first major surface and four minor surfaces substantially perpendicular to said major surfaces and joining said major surfaces, placing an insulating layer having a selected thickness on a selected portion of said first major surface, providing a lead frame having a plurality of conductors with distal and proximal ends and positioning the proximal ends of the conductors adjacent said first major surface of said chip and on said insulating layer, forming an electrical connection between each respective one of said proximal ends of said conductors and a respective one of each of said bonding pads on the chip, selecting a metallic plate, having a thickness sufficient to compensate for any bending moment induced in the chip by the application of the lead frame conductors and the insulating layer thereto;

securing said selected plate to said second major surface to provide a good thermal contact therewith, and compensate for any bending moment induced in the chip by the application of the lead frame conductors and the insulating layer thereto; and encapsulating and substantially enclosing, with an insulating material, said first major surface, said four minor surfaces, the proximal ends of said conductors and partially enclosing a portion of said distal ends of said conductors, a portion of said distal ends being cantilevered from said encapsulation;

placing said packages in a stack with a thermoplastic adhesive between abutting packages; and heating said stack of packages to bond each such package in said stack to an abutting package.

* * * * *